US006607869B1

(12) United States Patent
Kojima et al.

(10) Patent No.: US 6,607,869 B1
(45) Date of Patent: *Aug. 19, 2003

(54) OPTICAL INFORMATION RECORDING MEDIUM AND METHOD OF MANUFACTURING THE SAME

(75) Inventors: Rie Kojima, Kashihara (JP); Keiichiro Horai, Sanda (JP); Toshiaki Kashihara, Hirakata (JP); Noboru Yamada, Hirakata (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/113,264

(22) Filed: Jul. 10, 1998

(30) Foreign Application Priority Data

Aug. 22, 1997 (JP) .............................. 9-226049

(51) Int. Cl.[7] .................................. G11B 7/24
(52) U.S. Cl. .................. 430/270.13; 430/945; 369/288; 369/283; 428/64.5; 204/192.26; 204/152.27
(58) Field of Search ............................ 430/270.13, 945; 369/288, 283; 428/64.5, 64.6, 694 GR; 204/192.26, 192.27

(56) References Cited

U.S. PATENT DOCUMENTS

| | | | | |
|---|---|---|---|---|
| 4,904,543 A | * | 2/1990 | Sakahima et al. | 428/610 |
| 4,954,379 A | * | 9/1990 | Nishida et al. | 430/270.13 |
| 5,024,910 A | * | 6/1991 | Ohta et al. | 430/270.13 |
| 5,194,363 A | * | 3/1993 | Yoshioka et al. | 430/945 |
| 5,305,303 A | * | 4/1994 | Akahira et al. | 430/270.13 |
| 5,348,783 A | * | 9/1994 | Ohno et al. | 430/270.13 |
| 5,674,649 A | * | 10/1997 | Yoshioka et al. | 430/270.13 |
| 5,688,574 A | * | 11/1997 | Tamura et al. | 430/270.13 |
| 5,750,228 A | * | 5/1998 | Sakue et al. | 430/270.13 |
| 5,871,881 A | * | 2/1999 | Nishida et al. | 430/270.13 |
| 5,914,214 A | * | 6/1999 | Ohta et al. | 430/270.13 |

FOREIGN PATENT DOCUMENTS

| | | |
|---|---|---|
| EP | 243958 | 11/1987 |
| JP | 63-151486 | 6/1988 |
| JP | 4-10979 | 1/1992 |
| JP | 04-119884 | * 4/1992 |
| JP | 05144084 | 6/1993 |
| JP | 06-171234 | 6/1994 |
| JP | 2553736 | 8/1996 |
| JP | 09073668 | 3/1997 |
| JP | 10-016393 | 1/1998 |

OTHER PUBLICATIONS

Machine translation of JP 06–171234.*

Database Inspec, Institute of Electrical Engineers, Stevenage, GB, Kojima et al. "Quantitative study of nitrogen doping effect on cyclability of Ge–Sb–Te phase–change optical disks", XP002103561.

European Search Report, appln. No. 98305319, dated Jun. 10, 1999.

* cited by examiner

*Primary Examiner*—Martin Angebranndt
(74) *Attorney, Agent, or Firm*—RatnerPrestia

(57) ABSTRACT

An optical information recording medium having a recording layer for inducing a reversible phase change by irradiation with energy beam. The recording layer contains Te, Ge, Sb, and N, and the concentration of the N being contained is in a range of about 0.1% by atom to about 10% by atom. In this constitution, an excellent repeated recording and erasing performance is obtained.

26 Claims, 2 Drawing Sheets

6 Protective layer
5 Reflective layer
4 Second light interference layer
3 Recording layer
2 First light interference layer
1 Substrate 6 Protective layer
5 Reflective layer
4 Second light interference layer
3 Recording layer
7 Interface layer
2 First light interference layer
1 Substrate

OPTICAL INFORMATION RECORDING MEDIUM AND METHOD OF MANUFACTURING THE SAME

FIELD OF THE INVENTION

The present invention relates to an optical information recording medium such as optical disk for recording, reproducing and erasing information optically, and a method of manufacturing the same.

BACKGROUND OF THE INVENTION

An optical information recording medium, for example, an optical disk is generally composed in an multi-layer structure having a recording layer, a reflective layer, and a light interference layer, and a signal is read out by making use of the multiple interference effect. As the material for the recording layer, Te—Ge—Sb is known, in particular, pseudo-binary compositions of GeTe—$Sb_2Te_3$ present an excellent recording and erasing performance as high speed crystallizing material. As a method for enhancing the repeated recording and erasing performance of such pseudo-binary compositions, hitherto, as disclosed in Japanese Patent Registration No. 2553736, a method of mixing Sb in a compound of GeTe and $Sb_2Te_3$, and further adding nitrogen has been known. According to this Japanese Patent Registration No. 2553736, a recording layer composed by containing nitrogen in a mixture of GeTe, $Sb_2Te_3$ and Sb is formed by a sputtering method using a mixed gas of argon and nitrogen, and the mixing ratio is defined in a range of $0 \leq b \leq 1.0$ and $0.5 \leq g \leq 2.3$, where b is the molar ratio of $Sb/Sb_2Te_3$, and g is the molar ratio of $GeTe/Sb_2Te_3$. As a result, local phase segregation is arrested by addition of Sb, micro-material flow due to recording and erasing is suppressed by addition of nitrogen, and hence the repeated recording and erasing performance is enhanced.

However, in this Japanese Patent Registration No. 2553736, the concentration of nitrogen N amount contained in the mixture of GeTe, $Sb_2Te_3$ and Sb is not disclosed. By quantitating the N mount contained in the mixture of GeTe, $Sb_2Te_3$ and Sb, and repeating recording and erasing performance, as a result of evaluation of dependence of recording and easing performance on N concentration, it was known that the above performance is not established if the N amount is too small or too much, and that the N concentration has an optimum value and must be determined strictly. It was also known that the composition ratio of Te, Ge, Sb has effects on the reliability.

SUMMARY OF THE INVENTION

The optical information recording medium of the invention comprises a recording layer inducing a reversible phase change by irradiation with high energy beam provided above a substrate, this recording layer includes at least Te, Ge, Sb, and N, and the concentration of N contained in the whole composition is in a range of about 0.1% by atom to about 10% by atom.

More preferably, a first light interference layer, an interface layer, the recording layer, a second light interference layer, and a reflective layer are sequentially formed above the substrate. The interface layer is composed of nitride.

According to the manufacturing method of optical information recording medium of the invention, a recording layer inducing a reversible phase change by irradiation with energy beam is formed, and this recording layer is manufacturing in the process of sputtering a mother material including Te, Ge, and Sb in a gas atmosphere containing argon gas and nitrogen gas, and forming the recording layer including Te, Ge, Sb, and N.

More preferably, the concentration of the N content is in a range of about 0.1% by atom to about 10% by atom.

REFERENCE NUMERALS

Figure 1:
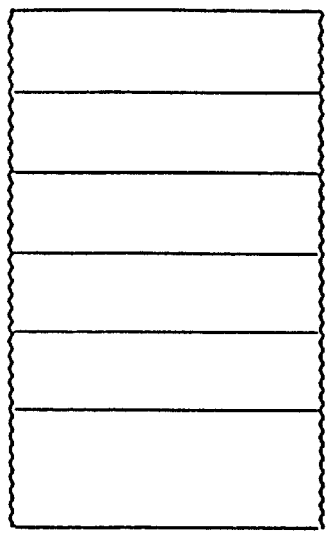
FIG. 1 is a partial sectional view of a constitution of an optical information recording medium in an embodiment of the invention.

1 Substrate
2 First light interference layer
3 Recording layer
4 Second light interference layer
5 Reflective layer
6 Protective layer
7 Interface layer

DETAILED DESCRIPTION OF THE INVENTION

It is the characteristic of the optical information recording medium of the invention that a recording layer inducing a reversible phase change by irradiation with high energy beam is provided on a substrate, that the recording layer contains at least Te, Ge, Sb, and nitrogen N, and that the concentration of N contained in the whole composition is in a range of about 0.1% by atom to about 10% by atom. In this constitution, the recording and erasing performance, repeated rewriting performance, and reliability are enhanced.

In other optical information recording medium of the invention, relating to the same optical information recording medium, the recording layer contains at least four elements, Te, Ge, Sb, N, and the composition of the three components Te, Ge, Sb is contained by the rate satisfying the composition formula $(GeTe)_x(Sb_2Te_3)_1Sb_y$ ($1.6 \leq x \leq 2.2$, $0 \leq y \leq 0.8$), and the concentration of N contained in the whole composition is in a range of about 0.5 to about 10% by atom. In this constitution, the recording and erasing performance, repeated rewriting performance, and reliability are enhanced.

In a different optical information recording medium of the invention, relating to the same optical information recording medium, the recording layer contains at least four elements, Te, Ge, Sb, N, and the composition of the three components Te, Ge, Sb is contained by the rate satisfying the composition formula $(GeTe)_x(Sb_2Te_3)_1Sb_y$ ($1.8 \leq x \leq 2.2$, $0y \leq 0.5$), and the concentration of N contained in the whole composition is in a range of about 1 to about 3% by atom. In this constitution, the recording and erasing performance, repeated rewriting performance, and reliability are enhanced.

In another optical information recording medium of the invention, relating to the same optical information recording medium, at least one layer of light interference layer and reflective layer, and the recording layer are formed on the substrate. In this constitution, the utilization efficiency of energy beam is enhanced, and the recording and erasing performance, repeated rewriting performance, and reliability are also enhanced.

In a further different optical information recording medium of the invention, relating to the same optical information recording medium, the light interference layer is mainly composed of ZnS—SiO$_2$. In this constitution, the utilization efficiency of energy beam is enhanced, and the recording and erasing performance, repeated rewriting performance, and reliability are also enhanced.

In a further different optical information recording medium of the invention, relating to the same optical information recording medium, the reflective layer is composed of Al or an alloy mainly made of Al, or Au or an alloy mainly made of Au. In this constitution, the utilization efficiency of energy beam is enhanced, and the recording and erasing performance, repeated rewriting performance, and reliability are also enhanced.

In a still different optical information recording medium of, the invention, relating to the same optical information recording medium, a first light interference layer, an interface layer, a recording layer, a second light interference layer, and a reflective layer are sequentially formed on the substrate, and the interface layer contains nitride. In this constitution, the recording and erasing performance, repeated rewriting performance, and reliability are further enhanced.

In a still different optical information recording medium of the invention, relating to the same optical information recording medium, a first light interference layer, a recording layer, a second light interference layer, and a reflective layer are sequentially formed on the substrate, and thickness d1 of the first light interference layer, thickness d2 of the recording layer, thickness d3 of the second light interference layer, and thickness d4 of the reflective layer are defined as 140≦d1≦200 (nm), 20≦d2≦30 (nm), 40≦d3≦60 (nm), and 50≦d4≦150 (nm). In this constitution, the recording and erasing performance, repeated rewriting performance, and reliability are enhanced.

In a still different optical information recording medium of the invention, relating to the same optical information recording medium, a first light interference layer, a recording layer, a second light interference layer, and a reflective layer are sequentially formed on the substrate, and thickness d1 of the first light interference layer, thickness d2 of the recording layer, thickness d3 of the second light interference layer, and thickness d4 of the reflective layer are defined as 100≦d1≦200 (nm), 20≦d2≦30 (nm), 10≦d3≦30 (nm), and 5≦d4≦30 (nm). In this constitution, the recording and erasing performance, repeated rewriting performance, and reliability are enhanced.

In a still further different optical information recording medium of the invention, the recording layer has a portion changing in the N content concentration in the thickness direction of the recording layer. It hence more strongly prevents micro-material flow between the light interference layer and recording layer, and further enhances the recording and erasing performance, repeated rewriting performance, and reliability.

In a still further different optical information recording medium of the invention, the recording layer has a portion changing in the N content concentration periodically in the thickness direction of the recording layer. In this constitution, a false interface layer is thinly formed in the recording layer, and it hence more strongly prevents micro-material flow between the light interference layer and recording layer, and further enhances the recording and erasing performance, repeated rewriting performance, and reliability.

Referring now to the drawings, embodiments of the invention are described specifically below.

Exemplary Embodiment 1

FIG. 1 is a partial sectional view showing a constitution of embodiment 1 of the optical information recording medium of the invention. In FIG. 1, a single plate structure is composed by laminating a first light interference layer 2, a recording layer 3, a second light interference layer 4, and a reflective layer 5 sequentially on a substrate 1, and applying a protective layer 6.

The substrate 1 is made of synthetic resin such as polycarbonate, amorphous polyolefin and polymethyl methacrylate, or glass. This substrate 1 is in a disk form, and, as required, guiding tracks are formed concentrically or spirally at pitches of about 1 micron. The substrate 1 has a homogeneous, transparent and smooth surface.

The first light interference layer 2 and second light interference layer 4 are dielectric thin films, and are effective for enhancing the light absorption efficiency into the recording layer by adjusting the optical distance, and for expanding the signal amplitude by increasing the change of quantity of reflected light before and after recording. The materials for the first light interference layer 2 and second light interference layer 4 include, for example, oxides such as SiO$_2$ and Ta$_2$O$_5$, nitrides such as SiN, AlN, TiN, TaN, ZrN and GeN, sulfides such as ZnS, carbides such as SiC, fluorides such as CaF$_2$, and their mixtures such as ZnS—SiO$_2$. The first light interference layer 2 and second light interference layer 4 can be formed by sputtering, vapor deposition, or other method. The film thickness of the first light interference layer 2 and second light interference layer 4 may be strictly determined in relation to the incident light wavelength so as to satisfy the condition of increasing the change of quantity of reflected light in the recording layer crystal state (before recording) and recording layer amorphous state (after recording) and the condition of increasing the light absorption rate to the recording layer simultaneously, according to the calculation on the basis of, for example, matrix method (Hiroshi Kubota: Pulse Optics, Iwanami Shinsho, 1971, chapter 3).

As the material for the recording layer 3, a material inducing reversible phase change between the crystal phase and amorphous phase may be used. As the material for the recording layer 3, that is, material adding nitrogen N to systems containing Te, Ge and Sb, such as Te—Ge—Sb, Te—Ge—Sb—Pd, Te—Ge—Sb—Se, Te—Ge—Sb—Bi, and Te—Ge—Sb—Cr, may be used. Among these systems, in particular in Te—Ge—Sb, a pseudo-binary composition of GeTe—Sb$_2$Te$_3$ can maintain a favorable recording and erasing performance as high speed crystallizing material, and the composition about GeTe:Sb$_2$Te$_3$=approx. 2:1 is best in phase stability and is preferable practically. The recording layer adding nitrogen to the system containing such Te, Ge and Sb is formed by reactive sputtering method in Ar gas and N$_2$ gas atmosphere, by using a material of the system containing Te, Ge and Sb as the mother material. By varying the sputtering condition, the concentration of N contained in the recording layer can be controlled. For example, by increasing the flow rate of $N_2$ gas, raising the partial pressure of $N_2$ gas, or lowering the sputtering power, reaction between ions popping out of the mother material and N is promoted, and the concentration of N contained in the recording layer can be increased. To the contrary, by decreasing the flow rate of $N_2$ gas, lowering the partial pressure of $N_2$ gas, or raising the sputtering power, reaction with N is retarded, and the concentration of N contained in the recording layer can be decreased. Among these sputtering conditions, the method of varying the flow rate of $N_2$ gas can control the concentration of N contained in the recording layer without practically lowering the sputtering speed. The sputtering apparatus to be used is realized by arbitrary combining a method having one mother material in one vacuum chamber, a method having a plurality of mother materials in one vacuum chamber, a stationary substrate one-by-one sputtering method, a self-revolution method, and an in-line method, and reactive sputtering with N is enabled.

The amount of a trace N contained in the recording layer 3 can be quantitated by secondary ion mass spectrometry (SIMS). By measuring the number of N atoms existing per unit volume, the concentration of N atoms in the number of all atoms combined with other elements can be calculated.

By controlling the concentration of N contained in the recording layer 3, the optical characteristic and thermal characteristic of the recording layer 3 can be controlled, and the recording performance, erasing performance, and rewriting performance of the optical information recording medium are changed. That is, by optimizing the N concentration contained in the recording layer, the recording and erasing performance suited to the conditions of use of the optical information recording medium (relative linear velocity range, laser wavelength, etc.), an excellent cycle performance, and a high reliability can be obtained.

Meanwhile, in the composition of Te, Ge, Sb, by mixing Sb in the vicinity of GeTe:$Sb_2Te_3$=approx. 2:1 ($Te_5Ge_2Sb_2$), the crystallization rate can be controlled. The N concentration varies somewhat with the composition of the recording layer, and is about 10% by atom at maximum, and preferably about 1% to about 3% by atom.

As the material for the reflective layer 5, Al, an alloy mainly made of Al, Au, or an alloy mainly made of Au may be used. The reflective layer is effective to increase the quantity of light absorbed in the recording layer optically, and to diffuse promptly the heat generated in the recording layer thermally, and also has a role of protecting the multi-layer film from the environments of use. These reflective layer materials are excellent in corrosion resistance, and superior to satisfy the quenching rate.

The protective layer 6 may be made of a synthetic resin. For example, it may be composed of a material mainly made of acrylic resin, or a material mainly made of epoxy resin. The protective layer 6 can be formed, for example, by applying on the reflective layer 5 and curing by irradiating with ultraviolet rays.

Exemplary Embodiment 2

A constitution of embodiment 2 of the optical information recording medium of the invention is described below by referring to the accompanying drawing.

Figure 2:
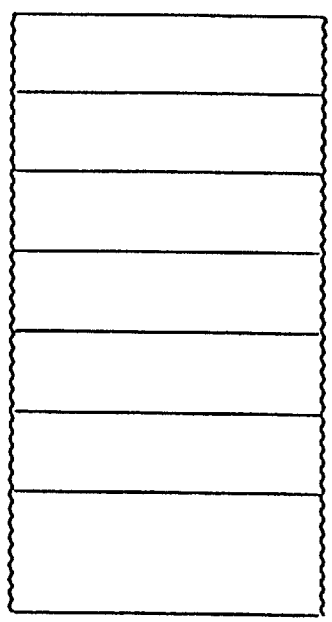
FIG. 2 is a partial sectional view of a constitution of other optical information recording medium in an embodiment of the invention.

FIG. 2 is a partial sectional view showing a constitution of embodiment 2 of the optical information recording medium of the invention. In FIG. 2, a first light interference layer 2, an interface layer 7, a recording layer 3, a second light interference layer 4, and a reflective layer 5 are laminated sequentially on a substrate 1, and a protective layer 6 of synthetic resin is applied thereon. This laminate body is a single plate structure.

The interface layer 7 contains nitride. As the nitride, for example, a material mainly composed of SiN, AlN, ZrN, TiN, GeN, or TaN is used. It is also possible to composed by adding Au, Ag, Cu, Pt, Pd, Ni, W, Mo, Cr, Ti, Ta, Nb, Se, Si, Bi or the like to these nitrides. This interface layer 7 has a function of preventing micro-material flow occurring between the first light interference layer 2 and the recording layer 3 due to repeated recording and erasing. By installing this interface layer 7, the cycle performance can be improved. These nitrides can be formed by reactive sputtering method in Ar gas and $N_2$ gas atmosphere, same as the recording layer 3. If the film is thick, the reflectivity and absorption of the multi-layer structure may change significantly to have effects on the recording and erasing performance, and hence the film thickness is preferably about 5 to about 30 nm, and more preferably about 10 nm.

Exemplary Embodiment 3

A constitution of embodiment 3 of the optical information recording medium of the invention is described below by referring to the accompanying drawing.

Figure 3:
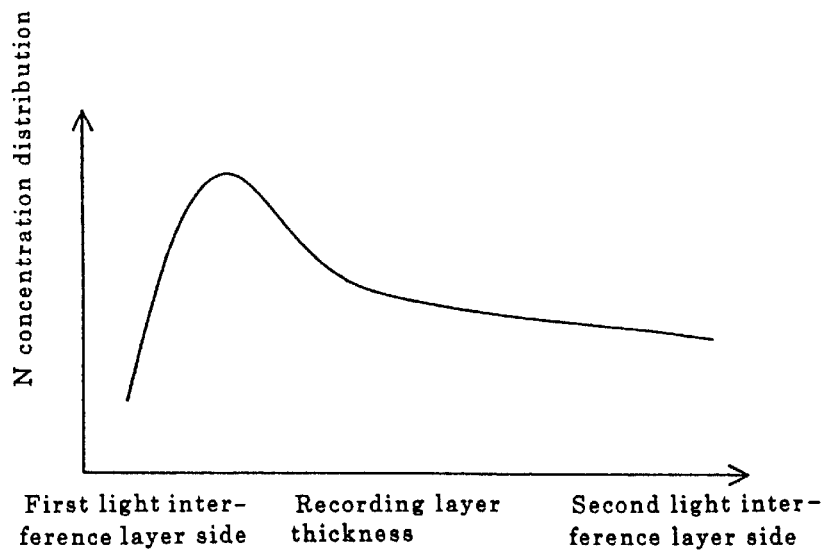
FIG. 3(a) is an N content concentration distribution characteristic diagram of recording layer of a different optical information recording medium in an embodiment of the invention.
FIG. 3(b) is an N content concentration distribution characteristic diagram of recording layer of a further different optical information recording medium in an embodiment of the invention.
Figure 3:
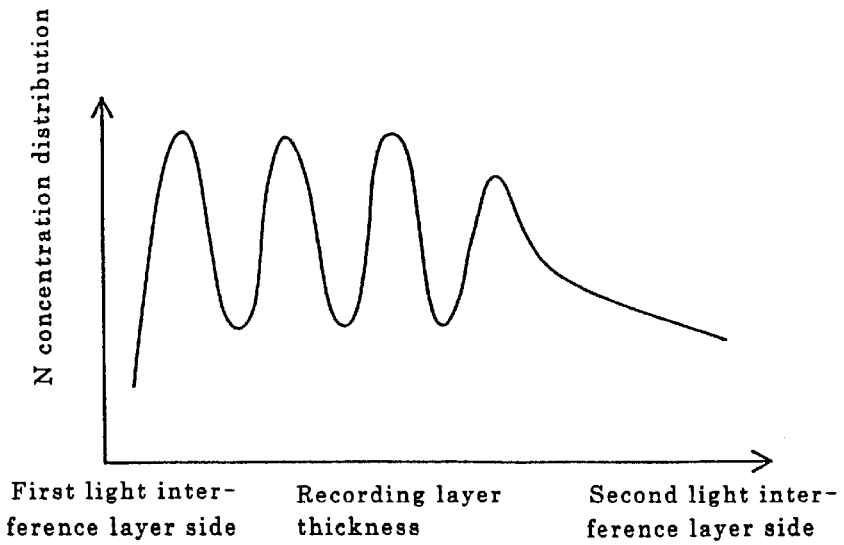

Characteristic diagrams of thickness direction and N concentration distribution of the recording layer are shown in FIG. 3(a) and FIG. 3(b). As shown in FIG. 3(a) and FIG. 3(b), by allowing the distribution of the N concentration of the recording layer 3 shown in FIG. 1 in the film thickness direction, the function of the interface layer 7 shown in FIG. 2 may be contained within the recording layer 3. As its method, the following three methods are known when forming the recording layer 3 by reactive sputtering in the Ar gas and $N_2$ gas atmosphere. After start of sputtering, the N concentration is raised, and as the sputtering progresses, the N concentration is lowered gradually. Or, after start of sputtering, the N concentration is raised to a specific level, and thereafter the n concentration is lowered to a specific level or gradually. Alternatively, N is contained after start of sputtering, and N is not added in the midst of the process. Thus, as shown in FIG. 3(a), a recording layer controlled of the N concentration in the thickness direction of the recording layer is formed. In any of these methods, the total N concentration contained in the recording layer 3 may be easily controlled by adjusting the $N_2$ gas flow rate, sputtering power, or $N_2$ gas partial pressure.

In particular, by periodically increasing or decreasing the $N_2$ gas flow rate, or periodically increasing or decreasing the sputtering power, as shown in FIG. 3(b), the N concentration in the recording layer 3 may be periodically changed in its thickness direction. Accordingly, without increasing the film thickness or the number of layers, the function for preventing micro-material flow between the first light interference layer 2 and recording layer 3 can be further reinforced.

Meanwhile, the distribution changing methods of the N concentration when laminating the recording layer 3 may be controlled by combining.

The description herein refers to an example of the optical information recording medium of single plate structure forming up to the protective layer 6, but this is not limitative. For example, two pieces of optical information recording medium forming up to the protective layer 6 may be glued at the protective layer side with, for example, a hot-melt adhesive, and the invention may be also applied in such optical information recording medium of two-side structure.

Practical examples of the invention are described below.

EXAMPLE 1

An experiment was conducted by using a stationary substrate one-by-one sputtering apparatus having a circular target and a vacuum chamber with a power source for generating vacuum discharge. First, to measure the sputtering speed of the recording layer, a thin film material was fabricated in the following procedure. Using a Te—Ge—Sb target, at sputtering power of 500 W and constant Ar gas flow rate, the flow rate of $N_2$ gas was changed in a range of 0 to 10 SCCM, and a thin film was formed by reactive sputtering method on each glass substrate piece. Measuring the film thickness by stylus method, the sputtering speed was calculated from the sputtering time. The sputtering speed was obtained from 5.2 to 4.1 nm/sec. Along with increase in the $N_2$ gas flow rate, the decline of the sputtering speed was about 20%. The results are shown in Table 1.

TABLE 1

| Condition No. | $N_2$ flow rate (SCCM) | Sputtering speed (nm/sec) |
|---|---|---|
| 1 | 0.00 | 5.2 |
| 2 | 0.03 | 5.2 |
| 3 | 0.05 | 5.2 |
| 4 | 0.10 | 5.2 |
| 5 | 0.30 | 5.2 |
| 6 | 0.50 | 5.1 |
| 7 | 1.00 | 5.0 |
| 8 | 1.50 | 4.9 |
| 9 | 3.00 | 4.7 |
| 10 | 5.00 | 4.5 |
| 11 | 7.00 | 4.3 |
| 12 | 10.00 | 4.1 |

EXAMPLE 2

To quantitate the nitrogen amount in the recording film from the obtained sputtering speed, a thin film material was fabricated. In the same condition as in example 1, about 300 nm was formed on a silicon substrate. In 12 kinds of thin film materials, the number of atoms per unit volume of nitrogen was determined by the secondary ion mass spectrometry (SIMS) method, and results are shown in Table 2.

TABLE 2

| Condition No. | $N_2$ flow rate (SCCM) | N concentration (% by atom) |
|---|---|---|
| 1 | 0.00 | <0.0003 |
| 2 | 0.03 | 0.09 |
| 3 | 0.05 | 0.25 |
| 4 | 0.10 | 0.49 |
| 5 | 0.30 | 1.0 |
| 6 | 0.50 | 1.6 |
| 7 | 1.00 | 2.4 |
| 8 | 1.50 | 3.1 |
| 9 | 3.00 | 5.9 |
| 10 | 5.00 | 10.1 |
| 11 | 7.00 | 12.2 |
| 12 | 10.00 | 16.3 |

There were $10^{19}$ to $10^{21}$ N atoms per 1 $cm^3$, and as for Te, Ge and Sb, the number of atoms per unit volume was calculated from the composition ratio, and the concentration of nitrogen atoms in the recording film was calculated from the ratio of number of atoms. When $N_2$ flow rate was increased, the number of N atoms also increased, and it was confirmed that N was incorporated in the film also in high speed sputtering of stationary substrate one-by-one sputtering process.

EXAMPLE 3

In the multi-layer composition forming the first light interference layer 2, recording layer 3, second light interference layer 4 and reflective layer 5 sequentially on the polycarbonate substrate, the optical calculation was conducted according to the matrix method. The first light interference layer 2 and second light interference layer 4 are composed of ZnS—$SiO_2$, the recording layer 3 is $(GeTe)_2(Sb_2Te_3)_1Sb_{0.3}$+N, and the reflective layer 5 is AlCr. The film thickness was determined strictly so that the reflectivity difference ΔR of amorphous phase and crystal phase and the absorption rate Ac of crystal phase would be greater. The calculated wavelength is 790 nm. The film thickness determined from the result of calculation was 155 nm in the first light interference layer 2, 23 nm in the recording layer 3, 43 nm in the second light interference layer 4, and 100 nm in the reflective layer 5.

EXAMPLE 4

Using Au in the reflective layer 5, the same experiment as in example 3 was conducted. The film thickness determined from the result of calculation was 130 nm in the first light interference layer 2, 23 nm in the recording layer 3, 24 nm in the second light interference layer 4, and 10 nm in the reflective layer 5.

EXAMPLE 5

By trial production of disks determined in example 3, the recording performance, erasing performance, and cycle performance of the disks were evaluated. The results are explained below. On the polycarbonate substrate 1 of 120 mm in diameter forming guiding tracks, 155 nm of ZnS—$SiO_2$ of the first light interference layer 2, 23 nm of $(GeTe)_2(Sb_2Te_3)_1Sb_{0.3}$+N of the recording layer 3, 43 nm of ZnS—$SiO_2$ of the second light interference layer 4, and 100 nm of AlCr of the reflective layer 5 were sequentially laminated by sputtering method, and an acrylic resin of the protective layer 6 as applied and cured by ultraviolet rays.

In the condition of x=2.0 of GeTe and y=0.3 of Sb, the N concentration of the recording layer 3 varied in 12 kinds as experimented in example 2, and samples in these compositions were prepared.

Rotating the disk at a speed of 2000 rpm, the laser with wavelength of 790 nm was emitted by modulating to the recording peak power and erasing bias power, and the carrier-to-noise ratio (CNR) and erasing rate in the innermost circumference and outermost circumference of each disk were measured. Herein, the disk was divided into plural zones of a specific width in the radial direction, and the number of division sectors in the circumferential direction is different in each zone, which is known as the MCAV system. The linear velocity of the innermost circumference is 5 m/s, and the linear velocity of the outermost circumference is 12 m/s.

The signal recording condition is 2-7RLL system of PPM for modulating at pit intervals. At a fixed ratio of recording peak power and erasing bias power, by varying the recording peak power at increments of 0.5 mW, and overwriting 4T signal to 1.5T signal, at CNR of 1.5T signal, the erasing rate was measured from the amplitude attenuation ratio of 1.5T signal. As a result, 1.5T was 9 MHz in the outermost circumference, and 4 MHz in the innermost circumference. From the results of measurement, the test power was set at a power 20% higher than the recording peak power at CNR=48 dB. Besides, the erasing bias power range of erasing rate≧20 dB was determined. The cycle performance was evaluated at the test power. The cycle life was determined from the error rate. The evaluation results of the outermost circumference are summarized in Table 3, and the evaluation results of the innermost circumference, in Table 4. In the tables, the CNR refers to the saturated value.

TABLE 3

Evaluation result and judgement of recording and erasing performance and cycle performance of outermost circumference at x = 2.0, y = 0.3

| Sample No. | N concentration (% by atom) | Test power (mW) | CNR (dB) | Erasing power margin (%) |
|---|---|---|---|---|
| Disk 1 | 0.0 | 13.5 ○ | 49.0 Δ | ±0.0 X |
| Disk 2 | 0.09 | 13.5 ○ | 49.5 Δ | ±2.1 Δ |
| Disk 3 | 0.25 | 13.4 ○ | 50.3 ○ | ±3.4 Δ |
| Disk 4 | 0.49 | 13.3 ○ | 50.5 ○ | ±5.8 ○ |
| Disk 5 | 1.0 | 13.1 ○ | 51.0 ○ | ±10.0 ◎ |
| Disk 6 | 1.6 | 12.7 ◎ | 52.0 ◎ | ±12.2 ◎ |
| Disk 7 | 2.4 | 11.5 ◎ | 52.3 ◎ | ±16.1 ◎ |
| Disk 8 | 3.1 | 11.0 ◎ | 52.0 ◎ | ±20.5 ◎ |
| Disk 9 | 5.9 | 9.1 ○ | 50.8 ○ | ±17.3 ◎ |
| Disk 10 | 10.1 | 7.3 Δ | 49.1 Δ | ±8.2 ○ |
| Disk 11 | 12.2 | X | 43.4 X | ±0.5 X |
| Disk 12 | 16.3 | X | <40.0 X | X |

Standard Power Judgement
 ◎: 11.0 mW or more to less than 13.0 mW
 ○: 13.0 mW or more to less than 14.0 mW, or 9.0 mW or more to less than 11.0 mW
 Δ: 14.0 mW or more to less than 15.0 mW, or 7.0 mW or more to less than 9.0 mW
 x: 15.0 mW or more to less than 7.0 mW
CNR Judgement
 ◎: 52.0 dB or more
 ○: 50.0 dB or more to less than 52.0 dB
 Δ: 48.0 dB or more to less than 50.0 dB
 x: Less than 48.0 dB
Erasing Power Margin Judgement
 ◎: ±10.0% or more
 ○: ±5.0% or more to less than ±10.0%
 Δ: ±1.0% or more to less than ±5.0%
 x: ±0.0% or more to less than ±1.0%

| Sample No. | N concentration (% by atom) | Cycle life (cycles) | Outermost circumference judgement |
|---|---|---|---|
| Disk 1 | 0.00 | 30,000 X | X |
| Disk 2 | 0.09 | 100,000 Δ | Δ |
| Disk 3 | 0.25 | 150,000 Δ | Δ |
| Disk 4 | 0.49 | 290,000 ○ | ○ |
| Disk 5 | 1.0 | 510,000 ◎ | ◎ |
| Disk 6 | 1.6 | 700,000 ◎ | ◎ |
| Disk 7 | 2.4 | 850,000 ◎ | ◎ |
| Disk 8 | 3.1 | 660,000 ◎ | ◎ |
| Disk 9 | 5.9 | 440,000 ○ | ○ |
| Disk 10 | 10.1 | 110,000 Δ | Δ |
| Disk 11 | 12.2 | 30,000 X | X |
| Disk 12 | 16.3 | X | X |

Cycle Life Judgement
 ◎: 500,000 cycles or more
 ○: 200,000 cycles or more to less than 500,000 cycles
 Δ: 100,000 cycles or more to less than 200,000 cycles
 x: Less than 100,000 cycles

TABLE 4

Evaluation result and judgement of recording and erasing performance and cycle performance of innermost circumference at x = 2.0, y = 0.3

| Sample No. | N concentration (% by atom) | Test power (mW) | CNR (dB) | Erasing power margin (%) |
|---|---|---|---|---|
| Disk 1 | 0.0 | 11.0 ○ | 50.5 ○ | ±23.5 ◎ |
| Disk 2 | 0.09 | 11.0 ○ | 51.0 ○ | ±23.8 ◎ |
| Disk 3 | 0.25 | 10.9 ○ | 51.8 ○ | ±24.3 ◎ |
| Disk 4 | 0.49 | 10.8 ○ | 52.1 ◎ | ±25.0 ◎ |
| Disk 5 | 1.0 | 10.6 ○ | 53.0 ◎ | ±26.7 ◎ |
| Disk 6 | 1.6 | 10.2 ◎ | 53.4 ◎ | ±27.4 ◎ |
| Disk 7 | 2.4 | 9.0 ◎ | 53.8 ◎ | ±27.6 ◎ |
| Disk 8 | 3.1 | 8.5 ◎ | 53.1 ◎ | ±28.6 ◎ |
| Disk 9 | 5.9 | 6.7 ○ | 49.5 Δ | ±25.9 ◎ |
| Disk 10 | 10.1 | 4.8 Δ | 48.0 Δ | ±11.1 ◎ |
| Disk 11 | 12.2 | X | <40.0 X | X |
| Disk 12 | 16.3 | X | <40.0 X | X |

Standard Power Judgement
 ◎: 8.5 mW or more to less than 10.5 mW
 ○: 10.5 mW or more to less than 11.5 mW, or 6.5 mW or more to less than 8.5 mW
 Δ: 11.5 mW or more to less than 12.5 mW, or 4.5 mW or more to less than 6.5 mW
 x: 12.5 mW or more to less than 4.5 mW
CNR Judgement
 ◎: 52.0 dB or more
 ○: 50.0 dB or more to less than 52.0 dB
 Δ: 48.0 dB or more to less than 50.0 dB
 x: Less than 48.0 dB
Erasing Power Margin Judgement
 ◎: ±10.0% or more
 ○: ±5.0% or more to less than ±10.0%
 Δ: ±1.0% or more to less than ±5.0%
 x: ±0.0% or more to less than ±1.0%

| Sample No. | N concentration (% by atom) | Cycle life (cycles) | Innermost circumference judgement | Overall judgement |
|---|---|---|---|---|
| Disk 1 | 0.00 | 110,000 Δ | Δ | X |
| Disk 2 | 0.09 | 110,000 Δ | Δ | Δ |
| Disk 3 | 0.25 | 130,000 Δ | Δ | Δ |
| Disk 4 | 0.49 | 220,000 ○ | ○ | ○ |
| Disk 5 | 1.0 | 430,000 ○ | ◎ | ◎ |
| Disk 6 | 1.6 | 580,000 ◎ | ◎ | ◎ |
| Disk 7 | 2.4 | 710,000 ◎ | ◎ | ◎ |
| Disk 8 | 3.1 | 500,000 ◎ | ◎ | ◎ |
| Disk 9 | 5.9 | 350,000 ○ | ○ | ○ |
| Disk 10 | 10.1 | 110,000 Δ | Δ | Δ |
| Disk 11 | 12.2 | X | X | X |
| Disk 12 | 16.3 | X | X | X |

Cycle Life Judgement
 ◎: 500,000 cycles or more
 ○: 200,000 cycles or more to less than 500,000 cycles
 Δ: 100,000 cycles or more to less than 200,000 cycles
 x: Less than 100,000 cycles As clear from these results, when the N concentration contained in the recording layer 3 increased, the test power became smaller and the recording sensitivity was higher. As in disks 11 and 12, if the N concentration is over 10% by atom, the sensitivity is too high, and it is possible to be recorded at the erasing bias power or induce signal deterioration by reproduced light, and further decline of CNR is significant, and it is hard to be used practically. On the other hand, at N concentration of 0.0% by atom, the erasing power margin of the outermost circumference is nil, and a margin is obtained at N concentration of 0.09% by atom. Therefore, the N concentration is required to be at least 0.1% by atom, and if 0.5% by atom or more, an erasing power margin of ±5% is assured. The cycle performance was also evident in dependence on N concentration, and the life of more than 500,000 cycles was obtained in the N concentration range of about 1 to about 3% by atom in the outermost circumference, and the life of more than 100,000 cycles was obtained in the N concentration range of about 0.1 to about 10% by atom.

Summing up and judging comprehensively, it is practical at the N concentration of the recording layer 3 in a range of 0.1 to 10.1% by atom in both inner and outer circumference, and in a range of 0.5 to 5.9% by atom, moreover, a favorable performance was obtained in all items, and in particularly in a range of 1.0 to 3.1% by atom, there was a sufficient power margin in both inner and outer circumference, and an excellent performance was obtained in all items. Therefore, a practical range of the N concentration of the recording layer 3 is 0.1 to 10.1% by atom, and the most preferred range of N concentration is about 1 to about 3% by atom.

EXAMPLE 6

Using GeTe at x=2.0, and Sb at y=0.0, 0.1, 0.2, 0.4, 0.5, 0.6, 0.7 0.8, 0.9, and 1.0, similar experiments as in example 5 were conducted. As a result, a same performance as in example 5 was obtained at y ranging from 0.0 to 0.8. When y was 0.9 or 1.0, the erasing rate in the outer circumference was 10 dB or less, not reaching the practical level. Results judged at y=0.9 are shown in Table 5, and results at y=1.0 in Table 6.

TABLE 5

Evaluation result and judgement of recording and erasing performance and cycle performance of outermost circumference at x = 2.0, y = 0.9

| Sample No. | N concentration (% by atom) | Test power (mW) | CNR (dB) | Erasing power margin (%) |
|---|---|---|---|---|
| Disk 13 | 0.00 | 13.2 ○ | 50.1 ○ | ±0.0 X |
| Disk 14 | 0.09 | 13.2 ○ | 50.6 ○ | ±0.0 X |
| Disk 15 | 0.25 | 13.1 ○ | 52.0 ⊙ | ±0.0 X |
| Disk 16 | 0.49 | 13.0 ○ | 52.5 ⊙ | ±0.0 X |
| Disk 17 | 1.0 | 12.8 ⊙ | 53.3 ⊙ | ±0.0 X |
| Disk 18 | 1.6 | 12.3 ⊙ | 53.5 ⊙ | ±0.0 X |
| Disk 19 | 2.4 | 11.1 ⊙ | 54.0 ⊙ | ±0.0 X |
| Disk 20 | 3.1 | 10.5 ○ | 53.6 ⊙ | ±0.0 X |
| Disk 21 | 5.9 | 8.8 Δ | 52.4 ⊙ | ±0.0 X |
| Disk 22 | 10.1 | 7.0 Δ | 50.6 ○ | ±0.0 X |
| Disk 23 | 12.2 | X | 45.0 X | X |
| Disk 24 | 16.3 | X | <40.0 X | X |

TABLE 6

Evaluation result and judgement of recording and erasing performance and cycle performance of outermost circumference at x = 2.0, y = 1.0

| Sample No. | N concentration (% by atom) | Test power (mW) | CNR (dB) | Erasing power margin (%) |
|---|---|---|---|---|
| Disk 25 | 0.00 | 13.0 ○ | 50.0 ○ | ±0.0 X |
| Disk 26 | 0.09 | 13.0 ○ | 50.7 ○ | ±0.0 X |
| Disk 27 | 0.25 | 13.0 ○ | 52.1 ⊙ | ±0.0 X |
| Disk 28 | 0.49 | 12.8 ⊙ | 52.5 ⊙ | ±0.0 X |
| Disk 29 | 1.0 | 12.6 ⊙ | 53.2 ⊙ | ±0.0 X |
| Disk 30 | 1.6 | 12.1 ⊙ | 53.4 ⊙ | ±0.0 X |
| Disk 31 | 2.4 | 10.9 ○ | 53.9 ⊙ | ±0.0 X |
| Disk 32 | 3.1 | 10.3 ○ | 53.8 ⊙ | ±0.0 X |
| Disk 33 | 5.9 | 8.6 Δ | 52.6 ⊙ | ±0.0 X |
| Disk 34 | 10.1 | 6.8 X | 50.5 ○ | ±0.0 X |
| Disk 35 | 12.2 | X | 45.2 X | X |
| Disk 36 | 16.3 | X | <40.0 X | X |

Standard Power Judgement

⊙: 11.0 mW or more to less than 13.0 mW

○: 13.0 mW or more to less than 14.0 mW, or 9.0 mW or more to less than 11.0 mW

Δ: 14.0 mW or more to less than 15.0 mW, or 7.0 mW or more to less than 9.0 mW x: 15.0 mW or more to less than 7.0 mW CNR Judgement ⊙: 52.0 dB or more ○: 50.0 dB or more to less than 52.0 dB Δ: 48.0 dB or more to less than 50.0 dB x: Less than 48.0 dB Erasing Power Margin Judgement ⊙: ±10.0% or more ○: ±5.0% or more to less than ±10.0%

Δ: ±1.0% or more to less than ±5.0% x: ±0.0% or more to less than ±1.0%

EXAMPLE 7

At x=1.6, 1.8, and 2.2 of GeTe, same experiments as in example 5 and example 6 were carried out. As a result, a same performance as in example 5 and example 6 was obtained when x was 1.8 or 2.2. At x=1.6, however, the crystallization rate was fast and the CNR value in the innermost circumference was low about 2 dB, but the erasing power margin was expanded to the contrary. Therefore, the practical range of x is from 1.6 to 2.2, and a preferred range of x is 1.8 to 2.2.

EXAMPLE 8

Disks in the composition in which the reflective layer determined in example 4 was Au were experimented same as in examples 5, 6 and 7. Same results as in examples 5, 6 and 7 were obtained.

EXAMPLE 9

A reliability test was conducted in order to confirm and determine the reliability of y-value of the recording layer 3. By adding 2% by atom of N to the recording layer 3 of which y-value is changed from 0.0 to 0.8 at 0.1 increments at x=2.0 of GeTe, five disks were prepared in each composition in example 3. Comparing the initial CNR value with the CNR value after letting stand for 200 hours at 90° C. and 80% RH, it is determined that the life is terminated when lowered by 3 dB. In order to judge in simultaneous consideration of applicability to high transfer rate, by rotating the disks at 2000, 3000, and 4000 rpm, the record storage (Archival) and overwrite characteristic (Shelf) were evaluated in the innermost circumference and outermost circumference of disk. The linear velocity is 5 to 12 m/s at 2000 rpm from the innermost circumference to the outermost circumference, 7.5 to 18 m/s at 3000 rpm, and 10 to 24 m/s at 4000 rpm. Therefore, the composition ratio usable in such linear velocity range is determined. The results are shown in Table 7. In the table, "A" refers to Archival, "S" is Shelf, "○" shows the CNR drop after standing for 200 hours at 90° C. and 80% RH of less than 3 dB of the initial value, and "x" means 3 dB or more.

TABLE 7

Reliability evaluation result and judgement at x = 2.0

| Sb y-value | Linear velocity (m/s) | | | | | | | | | | | |
|---|---|---|---|---|---|---|---|---|---|---|---|---|
| | 5 | | 7.5 | | 10 | | 12 | | 18 | | 24 | |
| | A | S | A | S | A | S | A | S | A | S | A | S |
| 0.0 | X | O | O | O | O | O | O | O | O | O | O | O |
| 0.1 | X | O | O | O | O | O | O | O | O | O | O | O |
| 0.2 | O | O | O | O | O | O | O | O | O | O | O | O |
| 0.3 | O | O | O | O | O | O | O | O | O | O | O | X |
| 0.4 | O | O | O | O | O | O | O | O | O | O | O | X |
| 0.5 | O | O | O | O | O | O | O | O | O | O | O | X |
| 0.6 | O | O | O | O | O | O | O | O | O | X | O | X |
| 0.7 | O | O | O | O | O | O | O | O | O | X | O | X |
| 0.8 | O | O | O | O | O | O | O | O | O | X | O | X |

○: CNR decline less than 3 dB
X: CNR decline 3 dB or more
▢: Usable at 4000 rpm
▢: Usable at 3000 rpm
▢: Usable at 2000 rpm As a result, the applicable y at 2000 rpm is the composition ratio of $0.2 \leq y \leq 0.8$, the applicable y at 3000 rpm is $0.0 \leq y \leq 0.5$, and the applicable y at 4000 rpm is $0.0 \leq y \leq 0.2$. Therefore, the y-value of Sb is practical in a range of $0.0 \leq y \leq 0.8$, and the value applicable to high transfer rate is in a range of $0.0 \leq y \leq 0.5$.

EXAMPLE 10

At x=1.6, 1.8, and 2.2 of GeTe, same experiments as in example 9 were conducted. As a result, when x was 1.8 or 2.2, same results as in example 9 were obtained. When x was 1.6, since the crystallization rate was fast, the results as shown in Table 8 were obtained.

TABLE 8

Reliability evaluation result and judgement at x = 1.6

| Sb y-value | Linear velocity (m/s) | | | | | | | | | | | |
|---|---|---|---|---|---|---|---|---|---|---|---|---|
| | 5 | | 7.5 | | 10 | | 12 | | 18 | | 24 | |
| | A | S | A | S | A | S | A | S | A | S | A | S |
| 0.0 | X | O | X | O | O | O | O | O | O | O | O | O |
| 0.1 | X | O | X | O | O | O | O | O | O | O | O | O |
| 0.2 | X | O | O | O | O | O | O | O | O | O | O | O |
| 0.3 | X | O | O | O | O | O | O | O | O | O | O | O |
| 0.4 | O | O | O | O | O | O | O | O | O | O | O | O |
| 0.5 | O | O | O | O | O | O | O | O | O | O | O | X |
| 0.6 | O | O | O | O | O | O | O | O | O | O | O | X |
| 0.7 | O | O | O | O | O | O | O | O | O | O | O | X |
| 0.8 | O | O | O | O | O | O | O | O | O | X | O | X |

At x=1.6, the applicable y at 2000 rpm is in a range of 0.4 ≤ y ≤ 0.8, the applicable y at 3000 rpm is 0.2 ≤ y ≤ 0.7, and the applicable y at 4000 rpm is 0.0 ≤ y ≤ 0.4. The y-value corresponding to each rotating speed at x=1.6 is different from that at x=1.8 to 2.2, but the practical range is 0.0 ≤ y ≤ 0.8. This result coincides with the performance in example 9. As for the x-value, the practical range is 1.6 ≤ x ≤ 2.2, and the most preferable range is 1.8 ≤ x ≤ 2.2.

EXAMPLE 11

Disks in the composition in which the reflective layer determined in example 4 was Au were experimented same as in examples 9 and 10. Same results as in examples 9 and 10 were obtained.

EXAMPLE 12

In the composition in example 3, using the recording medium in the composition having 10 nm of GeN as interface layer 7, the cycle performance of four kinds of disks of which N concentration of the recording layer 3 ranges from 1.0 to 3.1% by atom was evaluated. The results are explained. The evaluation conditions of cycle performance conform to example 5. Results are shown in Table 9.

TABLE 9

| | | Cycle life | |
|---|---|---|---|
| Sample No. | N concentration (% by atom) | Outermost circumference (cycles) | Innermost circumference (cycles) |
| Disk 37 | 1.0 | 720,000 | 550,000 |
| Disk 38 | 1.6 | 950,000 | 710,000 |

TABLE 9-continued

| | | Cycle life | |
|---|---|---|---|
| Sample No. | N concentration (% by atom) | Outermost circumference (cycles) | Innermost circumference (cycles) |
| Disk 39 | 2.4 | 1,040,000 | 850,000 |
| Disk 40 | 3.1 | 850,000 | 630,000 |

Considering from the results, as compared with example 5 without interface layer, the cycle performance was improved by about 200,000 cycles in the outermost circumference, and improved by about 100,000 cycles in the innermost circumference. By optimizing the N concentration of the recording layer 3 and installing the interface layer, the cycle performance could be improved dramatically.

The illustrated embodiments refer to the optical disks, but the invention is evidently applicable also in the optical cards, optical tapes, and other recording media based on the same principle.

Thus, according to the invention, by optimizing the composition ratio of Te—Ge—Sb of the recording layer and concentration of nitrogen to be added, and also by installing the interface layer, the recording and erasing performance, repeated rewriting performance, and reliability can be enhanced.

What is claimed is:

1. An optical information recording medium comprising, in order:
   a substrate;
   a first light interference layer;
   a recording layer;

a second light interference layer;
a reflective layer; and
a protective layer:
wherein:
  said recording layer comprises Te, Ge, Sb, and N;
  said recording layer is a composition of the formula $\{(GeTe)_x(Sb_2Te_3)_1Sb_y\}_{100-z}N_z$, where $1.6 \leqq x \leqq 2.2$; $0 \leqq y \leqq 0.8$; and $2 \leqq z \leqq 3.1$; and
  said recording layer is capable of undergoing a reversible phase change on irradiation with an energy beam disposed above said substrate;
  wherein said recording layer has a portion changing said concentration of said N in a thickness direction of said recording layer.

2. The optical information recording medium of claim 1 further comprising an interface layer disposed between said first light interference layer and said recording layer.

3. An optical information recording medium comprising a substrate and a recording layer capable of undergoing a reversible phase change on irradiation with an energy beam disposed above said substrate;
wherein:
  said recording layer comprises Te, Ge, Sb, and N,
  the concentration of said N is about 0.1% by atom to about 10% by atom, and
  said recording layer has a portion changing said concentration of said N periodically in a thickness direction of said recording layer.

4. The optical information recording medium of claim 3 wherein said recording layer is a composition of the formula $\{(GeTe)_x(Sb_2Te_3)_1Sb_y\}_{100-z}N_z$, where $1.6 \leqq x \leqq 2.2$; $0 \leqq y \leqq 0.8$; and z is about 1.6% to about 3.1%.

5. A manufacturing method of an optical information recording medium,
the method comprising the step of forming a recording layer by sputtering a mother material comprising Te, Ge, and Sb, in a gas atmosphere comprising argon gas and nitrogen gas
wherein:
  said recording layer is capable of undergoing a phase change on irradiation with an energy beam; and
  said recording layer is a composition of the formula $\{(GeTe)_x(Sb_2Te_3)_1Sb_y\}_{100-z}N_z$, where $1.66 \leqq x \leqq 2.2$; $0 \leqq y \leqq 0.8$; and $2 \leqq z \leqq 3.1$; and
  said step of forming said recording layer has at least one step selected from the group consisting of:
    (a) controlling a flow rate of said nitrogen gas,
    (b) controlling a partial pressure of said nitrogen gas, and
    (c) controlling a power of sputtering.

6. The manufacturing method of claim 5 additionally comprising, before the step of forming said recording layer, the step of
  forming a light interference layer above a substrate,
  wherein said recording layer is formed above said light interference layer.

7. The manufacturing method of claim 6 further comprising
  the step of forming a reflective layer above said recording layer.

8. The manufacturing method of claim 5 comprising the steps of:
  (a) forming a first light interference layer above a substrate,
  (b) forming said recording layer above said first light interference layer,
  (c) forming a second light interference layer above said recording layer, and
  (d) forming a reflective layer above said second light interference layer.

9. The manufacturing method of claim 5 comprising the steps of:
  (a) forming a first light interference layer above a substrate,
  (b) forming an interface layer above said first light interference layer,
  (c) forming said recording layer above said interface layer,
  (d) forming a second light interference layer above said recording layer, and
  (e) forming a reflective layer above said second light interference layer.

10. The manufacturing method of claim 5 comprising the steps of:
  (a) forming a light interference layer above a substrate,
  (b) forming an interface layer above said light interference layer, and
  (c) forming said recording layer above said interface layer,
  wherein said interface layer includes a nitride, and said nitride is formed in a step of sputtering a target in a gas atmosphere containing argon gas and nitrogen gas.

11. An optical information recording medium comprising, in order:
  a substrate;
  a first light interference layer;
  a recording layer;
  a second light interference layer;
  a reflective layer; and
  a protective layer;
wherein:
  said recording layer is a composition of the formula $\{(GeTe)_x(Sb_2Te_3)_1Sb_y\}_{100-z}N_z$, where $1.6 \leqq x \leqq 2.2$; $0 \leqq y \leqq 0.8$; and $2 \leqq z \leqq 3.1$; and
  said recording layer is capable of undergoing a reversible phase change on irradiation with an energy beam disposed above said substrate.

12. The optical information recording medium of claim 11 wherein the interface layer comprises a nitride.

13. The optical information recording medium of claim 12 wherein the nitride is SiN, AlN, ZrN, TiN, GeN, or TaN.

14. The optical information recording medium of claim 11 further comprising an interface layer disposed between said first light interference layer and said recording layer.

15. An optical information recording medium comprising, in order:
  a substrate;
  a first light interference layer;
  a recording layer;
  a second light interference layer;
  a reflective layer; and
  a protective layer;
wherein:
  said recording layer is a composition of the formula $\{(GeTe)_x(Sb_2Te_3)_1Sb_y\}_{100-z}N_z$, where $1.6 \leqq x \leqq 2.2$; $0 \leqq y \leqq 0.8$; and z is about 0.49 to about 3.1;
  said recording layer is capable of undergoing a reversible phase change on irradiation with an energy beam disposed above said substrate; and said N concentration of a portion of said recording layer changes periodically in a thickness direction of said recording layer.

16. The optical information recording medium of claim 15 wherein y=0.

17. The optical information recording medium of claim 16 wherein x is approximately 2.

18. The optical information recording medium of claim 15 further comprising an interface layer disposed between said first light interference layer and said recording layer.

19. The optical information recording medium of claim 15 further comprising an interface layer disposed between said first light interference layer and said recording layer.

20. A manufacturing method of an optical information recording medium, the method comprising the step of forming said recording layer by sputtering a mother material comprising Te, Ge, and Sb, in a gas atmosphere comprising argon gas and nitrogen gas;

wherein:
said recording layer is capable of undergoing a phase change on irradiation with an energy beam;
said recording layer comprises Te, Ge, Sb, and N;
said recording layer comprises about 1.6% by atom to about 3.1% by atom N;
said recording layer has a portion changing said concentration of said N periodically in a thickness direction of the recording layer; and
said step of forming said recording layer has at least one step selected from the group consisting of:
 (a) changing a concentration of said nitrogen gas periodically while sputtering; and
 (b) changing a sputtering power periodically while sputtering.

21. The manufacturing method of an optical information recording medium of claim 20 wherein the method comprises the step of changing the concentration of said nitrogen gas periodically while sputtering.

22. The manufacturing method of an optical information recording medium of claim 20 wherein the method comprises the step of changing the sputtering power periodically while sputtering.

23. The manufacturing method of an optical information recording medium of claim 20 wherein said recording layer is a composition of the formula $\{(GeTe)_x(Sb_2Te_3)_1Sb_y\}_{100-z}N_z$, where $1.6 \leq x \leq 2.2$; $0 \leq y \leq 0.8$; and z is about 1.6% to about 3.1%.

24. The manufacturing method of claim 23 in which z is about 2 to about 3.1.

25. An optical information recording medium comprising a substrate and a recording layer capable of undergoing a reversible phase change on irradiation with an energy beam disposed above said substrate;

wherein:
said recording layer comprises Te, Ge, Sb, and N,
the concentration of said N is about 1% by atom to about 3.1% by atom;
said recording layer has a portion changing said concentration of said N periodically in a thickness direction of said recording layer.

26. An optical information recording medium comprising, in order:
a substrate;
a first light interference layer;
a recording layer;
a second light interference layer;
a reflective layer; and
a protective layer;
wherein:
said recording layer is a composition of the formula $\{(GeTe)_x(Sb_2Te_3)_1Sb_y\}_{100-z}N_z$, where $1.6 \leq x \leq 2.2$; $0 \leq y \leq 0.8$; and z is about 1 to about 3.1;
said recording layer is capable of undergoing a reversible phase change on irradiation with an energy beam disposed above said substrate; and
said N concentration of a portion of said recording layer changes periodically in a thickness direction of said recording layer.

* * * * *